United States Patent
Kilthau et al.

(10) Patent No.: US 6,678,061 B2
(45) Date of Patent: Jan. 13, 2004

(54) METHOD OF CALIBRATING THE OPTICAL SYSTEM OF A LASER MACHINE FOR PROCESSING ELECTRICAL CIRCUIT SUBSTRATES

(75) Inventors: Alexander Kilthau, Bad Schoenborn (DE); Andre Kletti, Sandhausen (DE); Hans Juergen Mayer, Viernheim (DE); Eddy Roelants, Bruegge (BE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/121,731

(22) Filed: Apr. 15, 2002

(65) Prior Publication Data

US 2003/0002055 A1 Jan. 2, 2003

(30) Foreign Application Priority Data

Jun. 29, 2001 (DE) .......................... 101 31 610

(51) Int. Cl.⁷ .............................. G01B 11/14
(52) U.S. Cl. ................... 356/614; 356/243.1
(58) Field of Search .................. 356/614, 622, 356/623, 243.1, 243.2, 243.3, 243.4; 250/252.1, 559.29

(56) References Cited

U.S. PATENT DOCUMENTS

| | | | | |
|---|---|---|---|---|
| 4,682,894 A | * | 7/1987 | Schmidt et al. ............. | 356/614 |
| 5,530,548 A | * | 6/1996 | Campbell et al. ........... | 356/623 |
| 5,557,410 A | * | 9/1996 | Huber et al. ................ | 356/604 |
| 5,663,795 A | * | 9/1997 | Rueb ........................... | 356/614 |
| 5,772,656 A | * | 6/1998 | Klopotek ..................... | 606/12 |
| 5,867,261 A | * | 2/1999 | Imaino et al. ............ | 356/237.2 |
| 6,101,455 A | * | 8/2000 | Davis .......................... | 702/94 |

* cited by examiner

Primary Examiner—Hoa Q. Pham
(74) Attorney, Agent, or Firm—Harness, Dickey & Pierce, P.L.C.

(57) ABSTRACT

To calibrate the optical system of a laser machine having a laser source, a deflecting unit and an imaging unit, firstly a first sample plate is arranged in the focal plane of the imaging unit, with prescribed grid points being marked by the laser beam. After that, the marked points are measured by means of a camera, and their position values are compared with the prescribed position values of the target points, in order to derive first correction values from this and store them. After that, a second sample plate is arranged in a second calibrating plane, at a distance from the focal plane, and is targeted by the laser beam and provided with markings. The second sample plate is measured by the camera, and the measured positions of the markings are compared with the positions of the target points, in order to derive second correction values and store them. From the stored first and second correction values of the two planes, correction values can then be determined by interpolation for arbitrary target points in the spatial region between the focal plane and the second calibrating plane and be used for the activation of the deflecting unit.

14 Claims, 1 Drawing Sheet

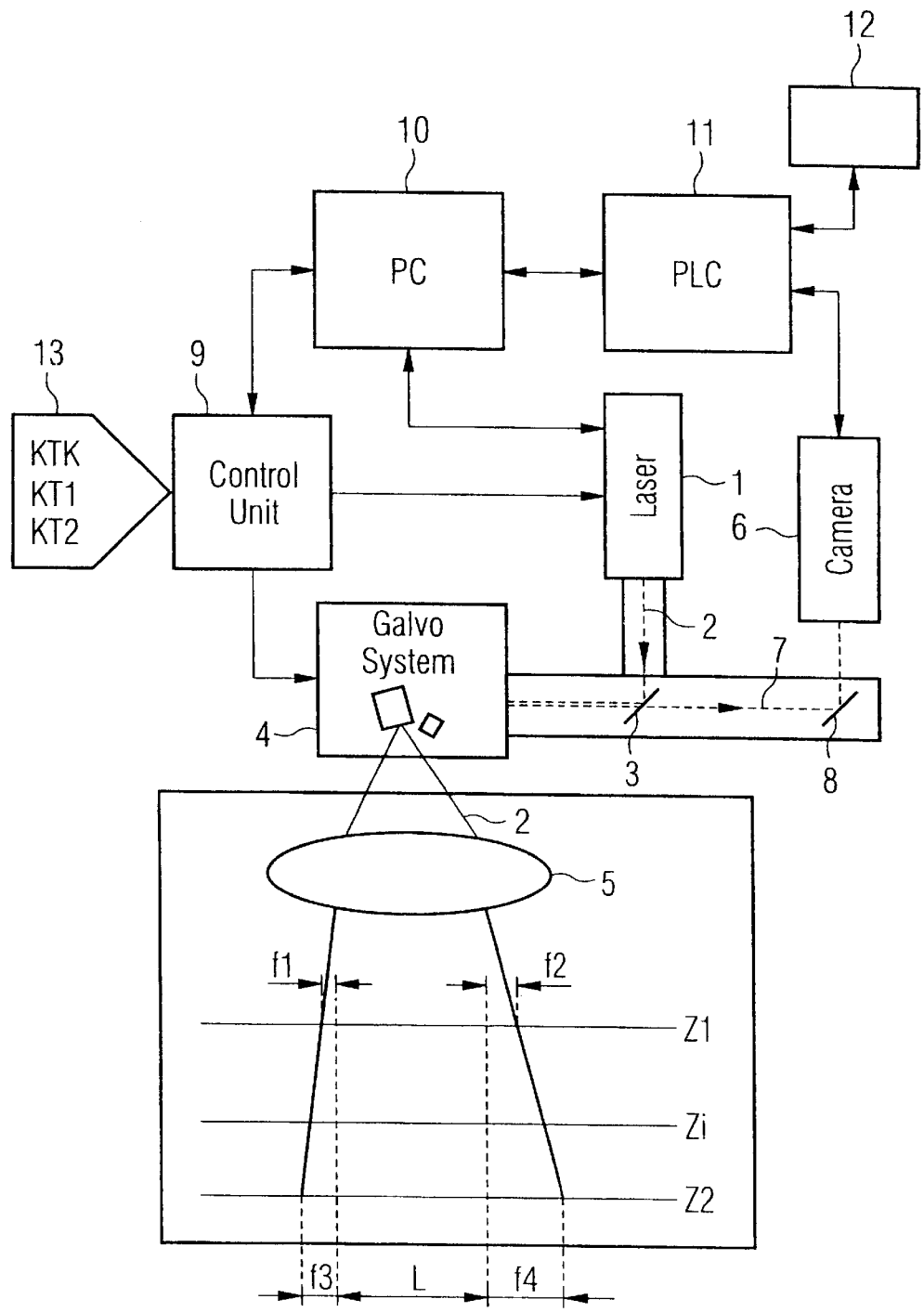

METHOD OF CALIBRATING THE OPTICAL SYSTEM OF A LASER MACHINE FOR PROCESSING ELECTRICAL CIRCUIT SUBSTRATES

This application claims priority under 35 U.S.C. Section 119 on German application number DE 10131610.0, filed on Jun. 29, 2001, the entire contents of which are hereby incorporated herein by reference.

FIELD OF THE INVENTION

The invention generally relates to a method of calibrating an optical system of a laser machine for processing electrical circuit substrates. Preferably, it relates to one in which the laser beam of a laser source is directed at target points of a processing surface via a deflecting unit and an imaging unit, the positions of markings on the processing surface being registered and measured with the aid of a camera.

BACKGROUND OF THE INVENTION

For the processing of electrical circuit substrates, for example printed circuit boards, lasers are being increasingly used whenever very fine structures are to be processed at great speed. This concerns, for example, the drilling of through-holes or blind holes for plating-through between various layers of a printed circuit board, the structuring of conducting layers or else non-conducting layers, of solder resists, etching resist layers and the like. In this case, for example, blind holes are drilled in a number of steps, it being possible for the actual processing plane to lie at a different height in relation to the focal plane of the optical system, in order for example to make different energy densities take effect.

As long as the laser beam is deflected only over a small processing surface, good positioning accuracy can be achieved, since in this case only the middle part of the telecentric lens necessary for the focusing of the laser beam is used. Since the optical axis of the f-theta lens always conforms well to telecentrics, there are also no problems when drilling or structuring is carried out outside the focal plane.

However, the wish to cover a greater processing area, in order to increase the working speed and yield with the laser beam, is increasingly arising, it then also being necessary to use the peripheral regions of the telecentric lens. Since, however, these lenses have an angular error that increases toward the peripheral region, the positioning errors increase all the more the further beam is used away from the optical axis.

A certain improvement can be achieved by measuring with the camera a pattern plate with precisely prescribed markings, deriving correction values from this and taking these into account when activating the deflecting system. However, it has been found that such correction values become increasingly inadequate for exact positioning the more the processing plane lies outside the focal plane.

SUMMARY OF THE INVENTION

One aim of an embodiment of the invention is to specify a method of calibrating the optical system of a laser machine for processing electrical circuit substrates. This can make it possible to process as large an area as possible with the laser and preferably at the same time, position the laser beam with greatest accuracy in the entire processing area and at different working heights with respect to the focal plane.

According to an embodiment of the invention, a method may have the following steps:

a first sample plate with a prescribed processing surface is arranged in the focal plane of the imaging unit as a first calibrating plane, after that target points prescribed on this sample plate are targeted with the laser beam in a grid covering the processing surface and are provided with markings, the positions of the markings of the first sample plate are measured with the aid of the camera and compared with the positions of the prescribed target points, first correction values from the deviations being stored in each case in a first correction table;

a second sample plate with the prescribed processing surface is arranged in a second calibrating plane parallel to and at a prescribed distance from the focal plane, after that the target points on this second sample plate are likewise targeted with the laser beam in the same grid as in the case of the first sample plate and provided with markings, the positions of the markings of the second sample plate are likewise measured and compared with the positions of the prescribed target points, second correction values being determined from the deviations and stored in each case in a second correction table, and the correction values from the first correction table and the second correction table are fed to a control unit, which determines as required for each target point in each arbitrary processing plane lying between the focal plane and the second calibrating plane in each case current correction values by interpolation from the first correction values and the second correction values and makes them available for the activation of the deflecting unit.

Consequently, in the method according to an embodiment of the invention, a calibration can be performed in at least two different planes, that is to say in the two extreme positions for the processing plane. This can involve determining the pincushion/barrel recordings and the angular errors of the telecentric lens in the two planes and practically converting them into a three-dimensional correction table. In this way, not only is a horizontal interpolation of the correction values possible in the two planes measured for the calibration, but any desired processing heights lying in between can also be interpolated. Consequently, a large recording area, for example 50 mm×50 mm, can also be used outside the focal plane, the advantage in terms of speed being accompanied by a consistent accuracy during processing.

In an advantageous refinement of the laser drilling machine, it is provided in a known way that the beam of the camera is directed over the same optical path as the laser beam. In this case, an additional optical error may be caused by the illumination for the camera image having a different wavelength than the laser beam. In this case, it is provided in a development of the invention that, before the irradiation of the first sample plate, a pattern plate (mapping plate) with the prescribed target points of corresponding, highly accurately marked grid points is arranged in the focal plane, that then the positions of the grid points are measured with the aid of the camera and that the deviations of the measured positions from the prescribed positions of the grid points are stored in a camera correction table and are taken into account during the determination of the correction values for the activation of the deflecting unit.

For special cases, it may also be desired to shift the processing plane not only toward one side of the focal plane, but also toward the other side of the focal plane. For this case, the following additional steps may be provided in a development:

a third sample plate with the prescribed processing surface is arranged in a third calibrating plane, parallel to the focal plane and at a prescribed distance from it, but lying opposite from the second calibrating plane with respect to the focal plane, after that, the target points on this sample plate are likewise targeted with the laser beam in the same grid as in the case of the first sample plate and the second sample plate and provided with markings, the positions of the markings of the third sample plate are measured with the aid of the camera and compared with the positions of the prescribed target points, third correction values being obtained from the deviations and stored in each case in a third correction table, and the correction values from the first correction table and the third correction table are fed to the control unit, which determines as required for each target point in each arbitrary processing plane lying between the focal plane and the third calibrating plane correction values by interpolation from the first correction values and the third correction values and makes them available for the activation of the deflecting unit.

In a further refinement, it is also possible, if required, to use a processing plane beyond the region of the second and possibly third calibrating planes used for the calibration, the correction values from the first correction table and the second and/or third correction tables then also being used to determine correction values by extrapolation for target points outside the region given by the focal plane and the second and/or third calibrating plane.

BRIEF DESCRIPTION OF THE DRAWINGS

The invention is explained in more detail below on the basis of an exemplary embodiment with reference to the drawing.

The single FIGURE shows a schematic representation of the various calibrating planes in conjunction with a block diagram of the laser processing arrangement.

DETAILED DESCRIPTION OF THE PREFERRED EMBODIMENTS

The FIGURE shows in block representation the main parts of a laser processing machine. The centerpiece is a laser source, the laser beam 2 of which is deflected via a dichroic mirror 3 and is fed to a galvanometer-mirror deflecting unit 4. This has two mirrors, which are movable about mutually perpendicular axes and with which the beam can be directed to any point of a processing area. For focusing, a telecentric lens 5, which focuses the beam into the desired plane, is arranged between the deflecting system 4 and the actual processing area. The focal plane is denoted in the present example by Z1. Ideally, this would cover an area with the side length L. Since, however, the lens 5 increasingly has deflection errors toward its peripheral region and, what is more, the deflecting system 4 is also affected by errors, the area actually reached by the laser beam is deformed in an approximately pincushion-shaped or barrel-shaped manner, so that, for example, deflecting errors f1 and f2 occur beyond the side length L in the peripheral regions of the processing area in the focal plane Z1, but in addition to that greater deflecting errors f3 and f4 occur in the peripheral regions of the processing surface in a processing plane Z2 remote from the focal plane. These deviations are also generally not symmetrical, but of different magnitudes to all sides.

The processing surface is measured by means of a camera 6, which receives a laser beam 7 over the optical path of the laser beam, that is to say via the lens 5 and the deflecting unit 4 and also via the dichroic mirror 3. This beam 7 is directed into the camera by means of a further mirror 8. A control unit 9, which is generally part of a computer 10, serves for controlling the laser source 1 and the deflecting unit 4. Furthermore, a stored-program controller 11 is provided, which controls both the camera and the robot 12 serving for the movement of the processing surface.

To calibrate the system, firstly a pattern plate, on which a grid of highly accurately arranged marking points covering the entire machining surface is recorded, is arranged over the focal plane Z1. These grid points are illuminated by means of an illuminating device (not represented), which contains, for example, light-emitting diodes of a wavelength of 800 nm, and is measured with the aid of the camera. The obtained coordinates of each individual marking point are compared with their known position values; deviations are stored in a camera correction table KTK, preferably in a memory 13 of the computer 10.

In the first actual calibrating step for the deflection of the laser beam, a first sample plate is then arranged in the focal plane Z1. This is, for example, a glass plate provided with a white coating. On this first sample plate, all the grid points of the prescribed processing area are then targeted as target points with the laser beam and marked, for example by a cross being burned in by the laser beam. These markings are subsequently scanned and measured with the camera 6, the measured coordinates being compared with the target coordinates of the individual grid points. The deviations are entered in the form of correction values into a first correction table KT1 in the memory 13.

In a further calibrating step, a blank second sample plate is then in turn arranged in a second processing plane Z2, which is remote from the focal plane Z1 by a prescribed amount. As in the case of the previous calibrating step, this time again each grid point of the processing area is targeted with the laser beam and burned in in the form of a marking. After that, again all the markings are scanned and measured by the camera 6; the deviations from the positional data of the target points are entered as second correction values into a second correction table KT2 in the memory 13.

With the correction values obtained and stored in this way, a correction value for each target point of an arbitrary plane Z1 in the spatial region between the focal plane Z1 and the second calibrating plane Z2 can be derived by interpolation from the two correction tables KT1 and KT2. Consequently, for example, bores can be positioned with an accuracy of ±5 μm.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of calibrating an optical system of a laser machine, the laser beam of a laser source being directed at target points of a processing surface via a deflecting unit and an imaging unit, and the positions of markings on the processing surface being registered and measured with the aid of a camera, comprising:

arranging a first sample plate with a processing surface in a focal plane of the imaging unit in a first calibrating plane, targeting target points on the sample plate with the laser beam in a grid covering the processing surface and providing the target points with markings, measuring the positions of the markings of the first sample plate with the aid of the camera and comparing them with the positions of the target points, wherein first correction values for correcting any deviations are determined from the comparisons and stored in a first correction table;

arranging a second sample plate with a processing surface in a second calibrating plane parallel to and at a prescribed distance from the focal plane, wherein, after that, target points on the second sample plate are targeted with the laser beam in the same grid as the first sample plate and are provided with markings, measuring the positions of the markings of the second sample plate and comparing them with the positions of the target points, wherein second correction values for correcting any deviations are determined from the comparisons and stored in a second correction table, and feeding the correction values from the first correction table and the second correction table to a control unit which determines, as required for each target point in each arbitrary processing plane lying between the focal plane and the second calibrating plane, correction values by interpolation from the first correction values and the second correction values and which makes them available for the activation of the deflecting unit.

2. The method as claimed in claim 1, wherein the beam of the camera is directed over the same optical path as the laser beam, the method comprising the following additional steps:

arranging a pattern plate, with the prescribed target points of corresponding highly accurately marked grid points, in the focal plane, before the irradiation of the first sample plate, measuring the positions of the grid points with the aid of the camera, and storing the deviations of the measured positions from the prescribed positions of the grid points in a camera correction table and using them during the determination of the correction values for the activation of the deflecting unit.

3. The method as claimed in claim 2, comprising the following additional steps:

arranging a third sample plate with the prescribed processing surface in a third calibrating plane, parallel to and at a prescribed distance from the focal plane, and lying opposite from the second calibrating plane with respect to the focal plane, targeting the target points on the sample plate with the laser beam in the same grid as in the case of the first sample plate and the second sample plate and provided with markings, measuring the positions of the markings of the third sample plate with the aid of the camera and comparing them with the positions of the prescribed target points, wherein third correction values are obtained from the deviations and stored in a third correction table, and feeding the correction values from the first correction table and the third correction table to the control unit, which determines, as required for each target point in each arbitrary processing plane lying between the focal plane and the third calibrating plane, correction values by interpolation from the first correction values and the third correction values and makes them available for the activation of the deflecting unit.

4. The method as claimed in claim 3, comprising the following additional step:

using the correction values of the first correction table and at least one of the second and third correction tables to determine correction values by extrapolation for target points outside the region given by the focal plane and at least one of the second and third calibrating plane.

5. The method as claimed in claim 2, comprising the following additional step:

using the correction values of the first correction table and at least one of the second and third correction tables to determine correction values by extrapolation for target points outside the region given by the focal plane and at least one of the second and third calibrating plane.

6. The method as claimed in claim 1, comprising the following additional steps:

arranging a third sample plate with the prescribed processing surface in a third calibrating plane, parallel to and at a prescribed distance from the focal plane, and lying opposite from the second calibrating plane with respect to the focal plane, targeting the target points on the sample plate with the laser beam in the same grid as in the case of the first sample plate and the second sample plate and provided with markings, measuring the positions of the markings of the third sample plate with the aid of the camera and comparing them with the positions of the prescribed target points, wherein third correction values are obtained from the deviations and stored in a third correction table, and feeding the correction values from the first correction table and the third correction table to the control unit, which determines, as required for each target point in each arbitrary processing plane lying between the focal plane and the third calibrating plane, correction values by interpolation from the first correction values and the third correction values and makes them available for the activation of the deflecting unit.

7. The method as claimed in claim 6, comprising the following additional step:

using the correction values of the first correction table and at least one of the second and third correction tables to determine correction values by extrapolation for target points outside the region given by the focal plane and at least one of the second and third calibrating plane.

8. The method as claimed in claim 1, comprising the following additional step:

using the correction values of the first correction table and at least one of the second and third correction tables to determine correction values by extrapolation for target points outside the region given by the focal plane and at least one of the second and third calibrating plane.

9. The method of claim 1, wherein the laser machine is for processing electrical circuit substrates.

10. An apparatus for calibrating an optical system of a laser machine, the laser beam of a laser source being directed at target points of a processing surface via a deflecting unit and an imaging unit, comprising:

a controller, adapted to control the laser beam to target target points on a first sample plate, with a processing surface in a focal plane of the imaging unit in a first calibrating plane, and provide the target points with markings, adapted to control a camera to measure the positions of the markings of the first sample plate and adapted to compare them with the positions of the target points, wherein first correction values for correcting any deviations are determined from the comparisons, adapted to control the laser beam to target target points on a second sample plate, with a processing surface in a second calibrating plane parallel to and at a prescribed distance from the focal plane, and provide the target points with markings, adapted to control the camera to measure the positions of the markings of the second sample plate and adapted to compare them with the positions of the target points, wherein second correction values for correcting any deviations are determined from the comparisons; and a memory, adapted to store the first and second correction values, wherein, from the first and second correction values, the controller is adapted to determine, as required for each target point in each arbitrary processing plane lying between the focal plane and the second calibrating plane, correction values by interpolation from the first correction values and the second correction values and wherein the controller is adapted to make them available for the activation of the deflecting unit.

11. A method for calibrating an optical system of a laser machine, the laser beam of a laser source being directed at target points of a processing surface via a deflecting unit and an imaging unit, comprising:

controlling a laser beam to target first target points on a first sample plate, with a processing surface in a focal plane of the imaging unit in a first calibrating plane;

provide the first target points with markings;

controlling a camera to measure the positions of the markings of the first sample plate;

comparing the measured positions with the positions of the first target points, wherein first correction values for correcting any deviations are determined from the comparisons;

controlling the laser beam to target second target points on a second sample plate, with a processing surface in a second calibrating plane parallel to and at a prescribed distance from the focal plane;

providing the second target points with markings;

controlling the camera to measure the positions of the markings of the second sample plate;

comparing the measured positions with the positions of the second target points, wherein second correction values for correcting any deviations are determined from the comparisons; and determining, from the first and second correction values, as required for each target point in each arbitrary processing plane lying between the focal plane and the second calibrating plane, correction values by interpolation from the first correction values and the second correction values, wherein the determined correction values are available for the activation of the deflecting unit.

12. The method as claimed in claim 11, wherein the beam of the camera is directed over the same optical path as the laser beam, the method comprising the following additional steps:

arranging a pattern plate, with the prescribed target points of corresponding highly accurately marked grid points, in the focal plane, before the irradiation of the first sample plate, measuring the positions of the grid points with the aid of the camera, and storing the deviations of the measured positions from the prescribed positions of the grid points in a camera correction table and using them during the determination of the correction values for the activation of the deflecting unit.

13. The method as claimed in claim 11, comprising the following additional steps:

arranging a third sample plate with the prescribed processing surface in a third calibrating plane, parallel to and at a prescribed distance from the focal plane, and lying opposite from the second calibrating plane with respect to the focal plane, targeting the target points on the sample plate with the laser beam in the same grid as in the case of the first sample plate and the second sample plate and provided with markings, measuring the positions of the markings of the third sample plate with the aid of the camera and comparing them with the positions of the prescribed target points, wherein third correction values are obtained from the deviations and stored in a third correction table, and feeding the correction values from the first correction table and the third correction table to the control unit, which determines, as required for each target point in each arbitrary processing plane lying between the focal plane and the third calibrating plane, correction values by interpolation from the first correction values and the third correction values and makes them available for the activation of the deflecting unit.

14. The method as claimed in claim 11, comprising the following additional step:

using the correction values of the first correction table and at least one of the second and third correction tables to determine correction values by extrapolation for target points outside the region given by the focal plane and at least one of the second and third calibrating plane.

* * * * *